(12) United States Patent
Beck

(10) Patent No.: US 9,714,964 B2
(45) Date of Patent: Jul. 25, 2017

(54) VOLTAGE-DEPENDENT METER

(75) Inventor: Bernhard Beck, Dimbach (DE)

(73) Assignee: BOB Holding GmbH, Volkach (DE)

( * ) Notice: Subject to any disclaimer, the term of this patent is extended or adjusted under 35 U.S.C. 154(b) by 0 days.

(21) Appl. No.: 13/475,453

(22) Filed: May 18, 2012

(65) Prior Publication Data

US 2012/0296785 A1 Nov. 22, 2012

(30) Foreign Application Priority Data

May 21, 2011 (DE) ........................ 10 2011 102 185

(51) Int. Cl.
*G01R 21/00* (2006.01)
*G01R 21/133* (2006.01)
*G01R 22/10* (2006.01)

(52) U.S. Cl.
CPC .......... *G01R 21/1335* (2013.01); *G01R 22/10* (2013.01)

(58) Field of Classification Search
CPC .. G01R 21/1335; G01R 22/10; G01R 21/133; G01R 22/00; G01R 21/1331; G01R 35/04; G01R 22/065; F24J 2/0444; F24J 2/5235; F24J 2/5239; F24J 2/5252; H01L 31/042; H01L 31/048; H01L 31/05; H02J 7/355; H02J 2003/003; H02J 2003/143; H02S 20/20; H02S 20/22; H02S 20/26; H02S 40/38
USPC ........................................................ 324/142
See application file for complete search history.

(56) References Cited

U.S. PATENT DOCUMENTS

| | | | |
|---|---|---|---|
| 2,294,692 A * | 9/1942 | Pratt | 324/103 R |
| 4,949,029 A | 8/1990 | Cooper et al. | |
| 5,059,896 A * | 10/1991 | Germer et al. | 324/142 |
| 5,216,357 A * | 6/1993 | Coppola | G01R 11/25 324/142 |
| 5,737,730 A | 4/1998 | Alvarenga et al. | |
| 6,084,394 A | 7/2000 | Windsheimer et al. | |
| 7,502,698 B2 * | 3/2009 | Uenou | G01R 21/133 324/141 |
| 2002/0045992 A1 * | 4/2002 | Shincovich | 702/58 |
| 2004/0113810 A1 * | 6/2004 | Mason, Jr. et al. | G01D 4/004 340/870.02 |
| 2009/0150100 A1 | 6/2009 | Pifer et al. | |

FOREIGN PATENT DOCUMENTS

| | | |
|---|---|---|
| DE | 695 05 787 T2 | 6/1999 |
| DE | 10 2010 027 170 A1 | 5/2011 |
| EP | 0 801 836 B1 | 7/1999 |
| EP | 0801836 B1 * | 7/1999 |
| WO | WO 97/21106 | 6/1999 |

* cited by examiner

*Primary Examiner* — Alesa Allgood
(74) *Attorney, Agent, or Firm* — Muncy, Geissler, Olds & Lowe, P.C.

(57) ABSTRACT

A meter for recording or determining the electrical energy withdrawn from an electrical supply network or supplied to it is provided. The meter including a component for measuring the current supply voltage, and a component for determining the operating mode based on the currently withdrawn or supplied electrical energy, wherein the operating mode can be changed, depending on the measured supply voltage, in such a way that a relatively high supply voltage causes a slower metering process than a comparatively low supply voltage.

23 Claims, 3 Drawing Sheets

VOLTAGE-DEPENDENT METER

This nonprovisional application claims priority under 35 U.S.C. §119(a) to German Patent Application No. DE 10 2011 102 185.3, which was filed in Germany on May 21, 2011, and which is herein incorporated by reference.

BACKGROUND OF THE INVENTION

Field of the Invention

The invention relates to a meter for recording the electricity consumption of electrical energy drawn off by a consumer from a supply network and/or for determining the electrical energy provided by a power producer to a supply network.

Description of the Background Art

A voltage dependent meter, which is often also called an electricity or watthour meter, is typically provided in each household to measure the electrical power drawn off from a supply network or the drawn-off electrical work for the purpose of consumption-based billing. To this end, typically the active current (alternating or three-phase current) and the currently applied active voltage, called the supply voltage hereafter, are measured. The utilized active energy in kilowatt hours (kWh) is determined by multiplying the current (active current) and voltage (active voltage) to obtain the electric power (P=U·I) and subsequent time integration of the electric power.

In the case of industrial consumers with especially high power peaks, power meters can also be provided, which in addition to the drawn-off electrical energy record whether the energy was drawn from the network within a relatively short time requiring an especially high power. These power peaks stress the supply network in particular and are to be billed accordingly. Similar meters are also located at entry points, such as, e.g., in solar photovoltaic roof systems or in wind turbines, to determine the electrical energy supplied by such an energy producer to a supply network.

Meters of the aforementioned type are known, e.g., from EP 0 801 836 B1 and from US 2009/0150100 A1 and U.S. Pat. No. 5,059,896. In the publication mentioned last, a watthour measuring device is described, which can be configured digitally, in order to operate as a type of different measuring device types.

In connection with the energy withdrawal from the supply network and the energy feed-in into the supply network, achieving a sufficient stability of the supply network is also desirable. The example of night storage heating can be used to clearly outline the problems associated therewith. Thus, the typical night storage heating is set up and intended to take up the electrical energy provided by the base load power plant during the off-peak periods generally occurring primarily at night and to supply it later during the day when the thermal energy is needed.

Because of the increasing distribution of alternative energies from wind and solar power plants, these cannot be used reasonably at present with a high generated energy demand and are therefore partially in remote storage, to buy them again at a later time; this is associated with corresponding costs. The shutting down of the power plant based on the conversion of renewable energy can be considered, as a result of which, however, producible energy cannot be generated per se. Alternatively for the interim storage of currently available, but not presently needed energy, an energy storage device is needed, such as, for example, a pumped storage power plant for large amounts of energy or night storage heating or underfloor heating for relatively small amounts of energy. A similar observation can be made about refrigeration devices, such as, e.g., a cold storage warehouse, which can be reduced beyond the required minus temperature, to store electrical energy in the form of cold, which otherwise must be drawn from the supply network at a time possibly unfavorable in terms of the supply network.

Without a functioning storage of electrical energy, instabilities in the network occur which are caused to a great extent by the use of renewable energy sources. It should be noted in this case that each feed-in of electrical energy tends to increase voltage, whereas each energy withdrawal tends to decrease voltage. Because the voltage-raising feed-in can be subject to rapid changes, the voltage level can also change at the assigned network connection point. In a photovoltaic system, local cloudiness may cause, for example, a 90% power drop, so that particularly in the case of larger wind power plants (wind farms) and in solar power plants the voltage in the supply network can vary on-site accordingly depending on the local weather conditions.

A so-called smart meter is known for turning on electricity-using devices, for example, household devices such as washing machines, driers, or the like at a time suitable from the viewpoint of the energy producer. In conjunction with such a smart meter, known, e.g., from the DE 10 2010 027 170 A1, such household appliances continue to operate according to their programming, however, after they are turned on, regardless of how the network situation has evolved during the on-time.

Particularly with alternative energy production, however, the production situation can change within a short time interval, for example, even within a minute, which is not taken into account by the smart meter. Disadvantageously, such smart meters are also very costly. In addition, the control of the smart meter by means of a control signal imposed on the supply voltage or separately transmitted requires large expenditures in terms of control and communication technology. The communication channels in particular result in considerable costs in the long term.

Further, a smart meter must be controlled to receive or deliver power. The current voltage situation on site continues to be disregarded, however. Thus, it cannot be ruled out that the local or supply network is to take up more energy, but the smart meters are controlled for power uptake, although at a site in the local network the maximum load, e.g., due to an industrial plant, has already been reached, and with a further power consumption by private households the network would fall below the limit in regard to its voltage. In addition, at another site due to the feed-in of power (solar current) generated by a photovoltaic plant it could be necessary to take up much more energy. The smart meter, however, regulates all consumers in the network as a whole.

SUMMARY OF THE INVENTION

It is therefore an object of invention to improve a meter of the aforementioned type to the effect that the utilization of electrical energy can be evaluated depending on network conditions. In particular, the user should be supplied with a decision criterion, to realize before the connection of a consumer whether the connection will contribute to stabilizing or destabilizing the supply network.

An embodiment of the invention is based on the premise that in addition to the storage of electrical energy the consumption as well can have a network-stabilizing effect, when this is done at a favorable time point in regard to network stabilization.

It is provided according to an embodiment of the invention to change the meter's operating mode as a function of the supply voltage present at the meter. In so doing, the change of the operating mode occurs in the sense that consumption or feed-in at a higher applied supply voltage leads to a slower metering process or to a lower billed amount than consumption or feed-in at a lower supply voltage. "Slower metering process or lower billed amount" can be understood to be all processes of an analog or digital type which have the result that a meter operation modified by the value of the dominant voltage or a modified billing procedure is carried out. The change in the operating mode can occur, for example, based on a suitable meter-internal algorithm or be initiated externally, for example, by impressing a control signal on the supply voltage or by wireless signal transmission, the meter being set up accordingly for this.

The change in the operating mode makes it possible, depending on the voltage situation in the network, to make the consumer aware of the consequences of starting up a device. It applies in general here that a high supply voltage indicates a network-side energy surplus and a too low supply voltage is an indicator of an energy shortage. This voltage can also be different in a local network.

When the meter is equipped with a unit for measuring the current supply voltage and the currently flowing current, as well as with a time acquisition unit, it is especially advantageous to use the voltage measurement, in addition to forming the power, also for forming an evaluation signal, which with consideration of its time course contributes to determining a billing unit. In this regard, the voltage course can be integrated over time and the value so determined used as a basis for the billing unit. Time acquisition within the present meaning is understood to be all devices that either clock by themselves, receive the time via communication means, or sample and count the number of sine waves in a network.

A direct connection to the energy costs is created via the billing unit modified in such a way. A supplier of electrical energy, such as a biogas power generator or an operator of a combined heat and power plant, often finds it desirable to have information on how valuable the exporting of his energy into the network actually is. In this regard, the evaluation signal is designed in such a way that it provides motivation for consumption at a high present voltage and in contrast discourages turning on an electrical device when the prevailing voltage is low. This also applies in a similar way to energy suppliers.

A preferred implementation of the evaluation signal is to use it or its integral value as a multiplication factor for the withdrawn (in the case of energy suppliers the supplied) electrical power and at present voltages above a top limit to set it as less than 1. The top limit at a nominal voltage in the supply network of 230 V can be, e.g., 235 V. In other words, when the prevailing voltage is above 235 V, therefore a stable, reliable supply situation is present, the factor of, e.g., 0.9 is selected, which corresponds to a direct supply-side savings of 10%. If, accordingly, an energy of, for example, n kWh is drawn off, only an energy withdrawal of 0.9·n kWh is calculated.

The reduction of the purchase price in this case can be applied here only for the part of the electricity price within the responsibility of the network operator, because legal regulatory charges (taxes, fees, etc.) are usually always calculated based on the absolute drawn-off electrical energy. In Germany at the time of filing, the current, which is taken in selectively for network stabilization according to the requirements by the network operator, is not subject to at least some regulatory charges.

If not only motivation is to be provided to draw off electrical energy at low voltages but alternatively or in addition the drawing-off at low voltages is to be sanctioned, at an available voltage below a bottom limit of, e.g., 225 V, the evaluation signal can be selected greater than 1. If accordingly in turn energy of n kWh is drawn off, now 1.1·n kWh is billed, because the consumption occurred at a network-destabilizing point in time.

Advantageously, the evaluation signal can be formed as a ratio of the nominal voltage of the supply network and the currently present supply voltage. As a result, there is a linear course which reduces the billing unit proportionally to the voltage increase or increases it proportionally to the voltage drop. In the middle region of the nominal voltage, the linear region can be replaced by a constant region. Within the voltage values within this region, the billing unit then remains unchanged.

An embodiment further aiding the stabilization of the network conditions provides that the evaluation signal increases disproportionately at least within a subrange of voltages below the nominal voltage. At a low supply voltage of, e.g., 215 V, which is close to the bottom limiting voltage of, e.g., 210 V, consumption should result in such a high billing unit that starting up an electrical device merits economic reconsideration. The disproportionality in this case can be realized by a logarithmic function, a parabolic function, or a trigonometrically based function. If the supply voltage is, e.g., near 245 V, then the distance to an unstable situation of more than 250 V, in which an electrical device could be damaged, is only 5 V. To motivate consumers to use the device now to lower the voltage, e.g., the evaluation unit can be halved or reduced still further. Here, the evaluation unit declines disproportionately at least within a subrange of voltages above the nominal voltage.

Regarded as essential is the presence of a display unit whose visual display in particular shows a measure for the value of the billing unit. In this case, the display unit should show at least two of the following parameters:

i) the totaled metered kWh value without the use of the evaluation signal,
ii) a totaled value kW(V)h corrected with the use of the evaluation signal,
iii) a course of the formed evaluation signal,
iv) a course of the determined billing unit,
v) the value of the currently present evaluation signal,
vi) by means of a color scheme, a measure for the current network support or network load,
vii) a diagram of the billing unit versus the voltage with identification of the current operating point,
viii) the amount of the cumulative electrical work without the use of the evaluation signal, the amount of the cumulative electrical work corrected with the use of the evaluation signal, and a measure for the difference between the two amounts, and
ix) the predicted monetary benefit of a currently to-be-undertaken startup of an electrical consumer.

The display under i) corresponds to the current conventional process that the user can read at any time the usage accrued until then on the meter. Because a voltage-dependent formation of billing units now occurs, the use of multi-rate meters can be omitted.

A display of the totaled kW(V)h value corrected with the aid of the evaluation signal makes possible a first estimation of the extent to which up to the current time a network-stabilizing consumption approach was or was not implemented. The unit kW(V)h is derived in this regard from the modification of the detected withdrawn electrical energy in kWh with further voltage effect. If, for example, the mentioned ratio of the nominal voltage to the prevailing voltage is used as the modification, no physical unit is added on. The V placed in parentheses symbolizes that the indicated value was influenced further with consideration of the supply voltage compared with the classic measurement using the product of voltage U and current I.

The information on the course of the formed evaluation signal or the course of the determined billing unit makes it possible for the consumer or user to estimate whether the current billing unit will be maintained in the near future or not. In a weather-related unfavorable volatile course, the billing unit can change more easily than under weather conditions favorable for renewable energy generation.

The value of the currently present evaluation signal, in contrast, is a means for informing the consumer about the reasonableness of an immediate startup of the electrical device. The use of colors can also be expedient as a measure for the current network support or network loading. An advantageous display type may be a diagram representation of the billing unit versus the voltage with identification of the current operating point.

An embodiment with respect to variants i) to ix) can also be the display of the integrated withdrawn electrical power without the use of the evaluation signal and the withdrawn energy corrected with the use of the evaluation signal, as well as the difference between these two values. A measure in this case can be a bar whose width or length indicates the network support or loading, a color depiction of the same, a direct display of the monetary usage, etc.

Further embodiments may be that the course of the evaluation signal versus the voltage is fixedly predetermined, or a course to be used at present, which is communicated to the meter as temporarily valid, is selected by means of a ripple control signal on the part of the network operator from a predetermined curve set.

Particularly also in existing electromechanical or electronic meters, the inventive concept can be implemented in that the operating mode is variable in the sense that the consumption or the feed-in at a higher applied supply voltage results, as it were, in a slower metering process than consumption at a lower supply voltage. The optimal benefit is achieved when a plurality of said meters is used.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
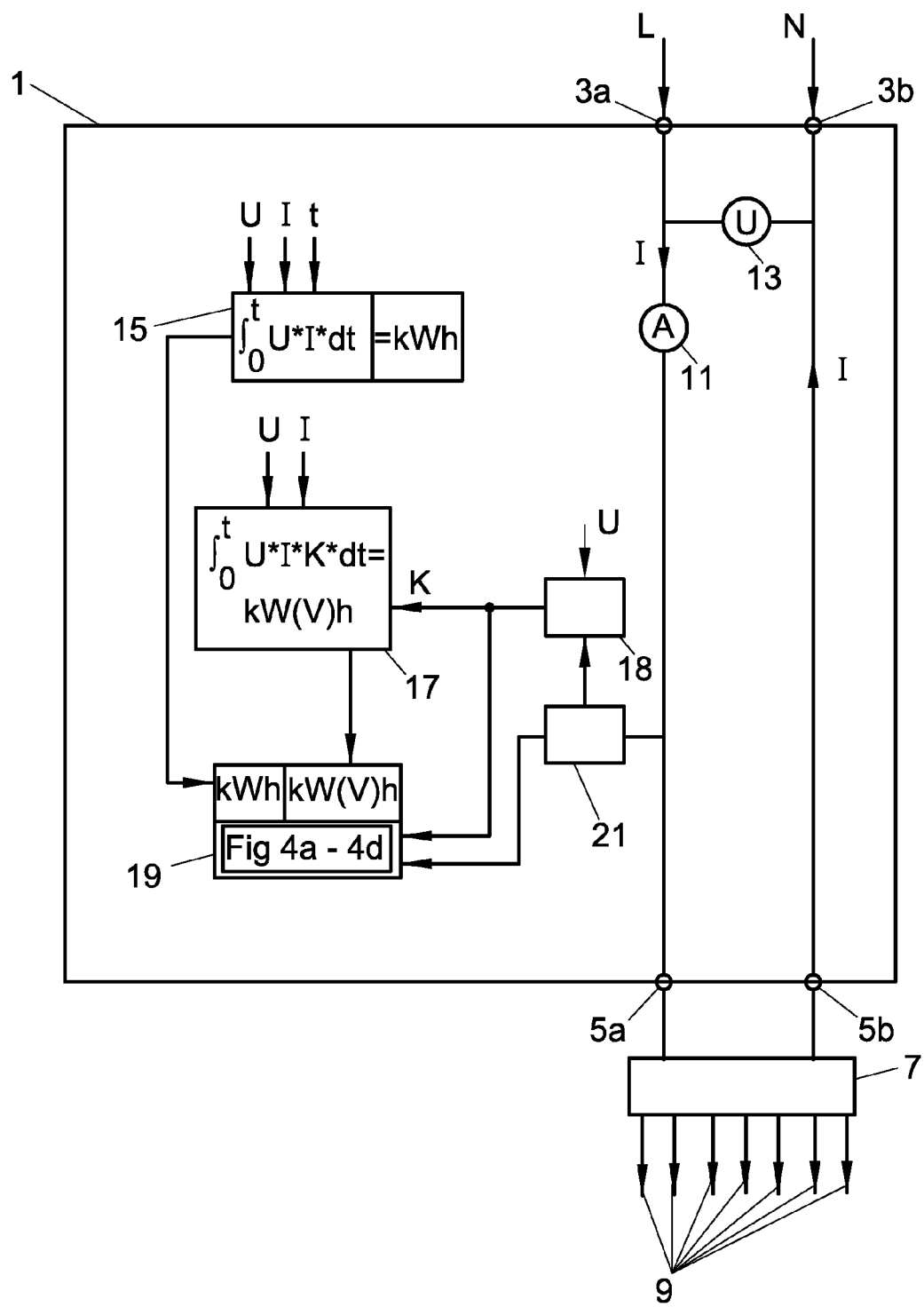
FIG. 1 shows a meter according to an embodiment of the invention.

FIG. 1 shows schematically a meter 1 for drawing electrical energy with two input terminals 3a, 3b and two output terminals 5a, 5b. A conductor L and a neutral conductor N of a supply network, which is not shown in greater detail and is operated by a network operator, are connected to input terminals 3a, 3b. A home distribution box 7, from which in turn numerous power supply lines 9 can lead to various rooms in the building, is connected to output terminals 5a, 5b of meter 1. For the sake of clarity, meter 1 is shown only in connection with a phase L. However, meter 1 can also be connected to a number of available phases (L1, L2, L3). Each phase individually or also a composite voltage value, which is formed from the voltages U of the individual phases, can be used for the voltage-dependent measurement.

Meter 1 comprises in a manner known per se an ammeter 11 and a voltmeter 13. The measured values for the current I and voltage U are supplied with a time signal t to an integrator 15, which forms the integral of the product of the current I and voltage U over time from these values. The result is a value of the electrical active energy or the electrical work in the conventional billing unit kWh, which so far has been calculated without use of the present invention over a predetermined time period by the network operator with a previously established billing rate for the kWh.

Meter 1 has a computing element 17, which is supplied with input signals, namely, the voltage U, current I, and a correction factor K, whose voltage-dependent course is transmitted optionally by the network operator modulated on one of the supply lines L, N or wirelessly, for example, via radio. This is indicated in FIG. 1 by a line between a correction factor-forming unit 18 and a receiving part 21 connected to a conductor L of the network. The correction factor K can also be formed only from the currently present voltage U, without requiring current support from the network operator. The formation of the correction factor K is voltage-dependent and will be explained in greater detail below with FIG. 2.

Computing element 17 includes an integrating element, which integrates the product of voltage U, current I, and correction factor K over the time t. The result is the formation of a fictitious billing unit kW(V)h, where the V in parentheses is intended to indicate that the fictitious billing unit kW(V)h is modified by means of a voltage-dependent correction factor K. Correction factor K and/or the course thereof versus the voltage U can be fixedly predetermined or be formed from the modulated signal mentioned above via correction factor-forming unit 18, provided said unit is connected to receiving part 21 described below. The modulated signal allows the network operator to form the correction factor K especially for a current network situation.

The drawn-off energy in kWh and the fictitious billing unit kW(V)h formed by means of the correction factor K are shown on a display 19. The shown display 19 is shown, for example, with three fields, of which one field is used to show the drawn-off energy in kWh, a second field to show the cumulative billing units in kW(V)h, and the third field to show a decision-making aid whether an upcoming startup of an electrical device at the present time has a network-supporting or network-loading effect.

Display 19 is preferably connected in addition to receiving part 21, in which a signal, modulated on one of the supply lines L, N, of the network operator can be decoded. The signals received by receiving part 21 relate to information on rate setting by the network operator in the currently present supply situation. This information can tell the user the savings or the additional financial charge of a startup of an electrical device particularly in connection to the currently present correction factor K. The savings or additional charge, for example, in cents, is shown for the direct, future consumption standardized to the accruing energy in kWh. This decision-making aid for the consumer, whether the device should be turned on now or later, can be derived in principle also solely from the value of the upcoming correction factor K.

The information received via receiving part 21 makes possible other current features in the rate, which do not depend on the prevailing voltage U or are not covered by the courses of the correction factor K according to FIG. 3. Thus, e.g., a user who buys 100% green power can be motivated by an extremely high billing unit kW(V)h or a correspondingly high billing rate to refrain from additional energy consumption, because currently a sufficient proportion of green power is not being handled on the power exchange. Analogously, the user can be motivated to consume when an excess of green power is available.

An observant consumer has the option of contributing to a compensation mechanism for upward or downward voltage fluctuations in the supply network, in that he takes measures to reduce the energy stored in heating or cooling devices or saves energy, depending on whether the prevailing voltage is high (store energy) or low (use stored energy). The current costs can be a suitable motivation in this case.

If, for example, the voltage is high in winter, because more wind and solar energy is fed into the network than is presently removed, the billing unit in kW(V)h can be set advantageously such that the consumer heats rooms with lower-cost current and discontinues the electrical heating later on during the day with more costly current. It is also practicable to automate the connection process to the effect that the devices measure the voltage independently and turn on or off automatically based on the measured voltage level. The connection decision in this regard can consider device-based storage for network stabilization, provided the employed devices are suitable for this, such as, for example, a freezer or a storage heater.

Figure 2:
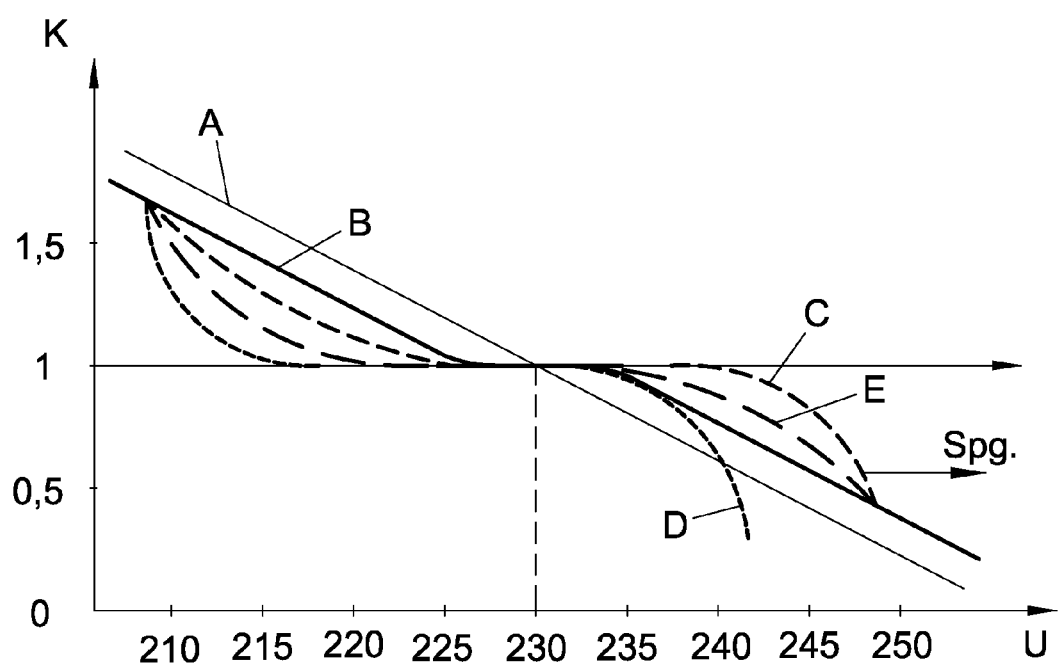
FIG. 2 shows different curves for a voltage-dependent correction factor K for determining a modified billing unit.

Possible courses for the correction factor K versus the voltage U are plotted in FIG. 2. Curve A represents a straight line, which runs through the point formed by the value pair K=1 and U=230 V as the nominal voltage. The slope of the line corresponds to the $U/U_{Nom}$ ratio of the measured voltage U and the nominal voltage $U_{Nom}$ multiplied by a factor for the desired variance in the pricing, therefore whether moderate savings at high voltages along with a moderate increase in cost at low voltages U are desired.

Curve B in the region between 225 V and 235 V has a linear region in which there is no change of the correction factor K. K=1 corresponds to a kWh of a billing unit kW(V)h. At a voltage U less than 225 V, the current purchase according to the shown linear course is more costly, because the correction factor K shifts to values greater than 1. At a voltage U greater than 235 V, the current purchase according to the shown linear course is less expensive, because the correction factor K shifts to values less than 1. The slopes can be selected as the same or, depending on the strategy of the network operator, as different; i.e., network-supporting measures versus network-loading measures can go hand in hand with correspondingly low or high billing rates.

Curves C, D, and E are possible examples of other variants of the course of the correction factor K. In receiving part 21 any curve set can be preprogrammed from which the network operator can select a currently preferred curve via the ripple control signal or wirelessly. Receiving part 21 can also receive curves that were not preprogrammed and can add them to the curve set. The curves have in common a relatively steep decline in the correction factor K at higher voltages U, which leads to a smaller billing unit kW(V)h, and a relatively steep increase of the correction factor K at lower voltages U, which leads to higher billing units kW(V)h.

Figure 3A:
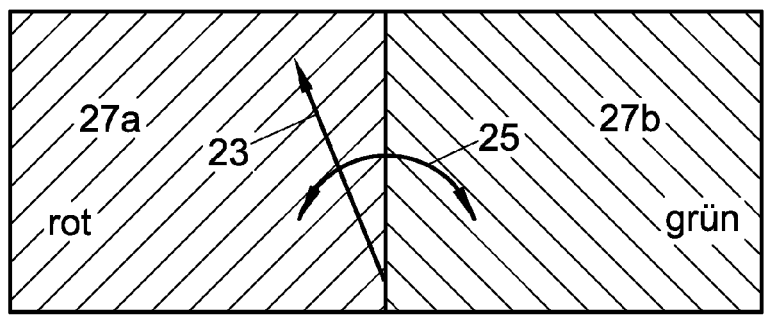
FIGS. 3a-3d show displays of different information variants for a consumer.

Exemplary images, which can serve as decision-making aids for the consumer with respect to the time of the startup of an electrical device, are shown in FIGS. 3a to 3d. FIG. 3a shows as a decision-making aid a pointer 23, which can change its position in the direction of a double arrow 25 within a highlighted red area 27a and a highlighted green area 27b. A change occurs in regard to the currently present voltage U. In so doing, a position of the pointer 23 in the green area 27b signals that the immediate startup of the electrical device has a network-supporting effect. If, in contrast, pointer 23 is in the red area 27a, the immediate startup would be network-loading.

Figure 3B:
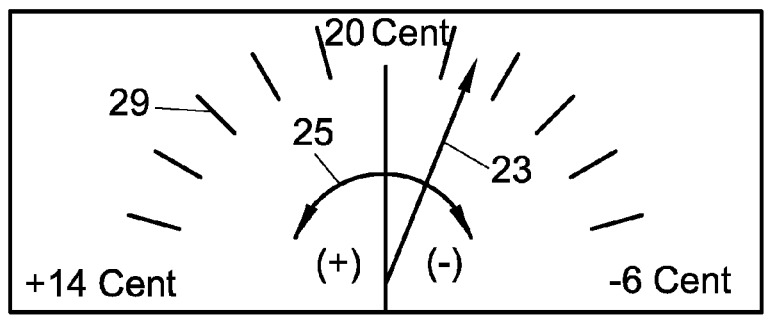

A similar pointer image is shown in FIG. 3b, where instead of the colored areas 27a, 27b a scale 29 is provided, which indicates the direct value of the billing unit kW(V)h in cents. Pointer 23 then indicates the current rate value for a kWh, when the device is put into operation. Scale 29 can also be arranged in such a way that the savings or the additional charge in relation to the standard rate is identified. In FIG. 3b this would be zero cents (0¢) in the middle position of pointer 23, instead of the tariff price of twenty cents (20¢), and plus fourteen cents (14¢) in a pointer position on the left end of scale 29, and minus six cents (6¢) in a pointer position at the right stop. The display can also occur with decimal numbers or the like instead of pointer 23.

Figure 3C:
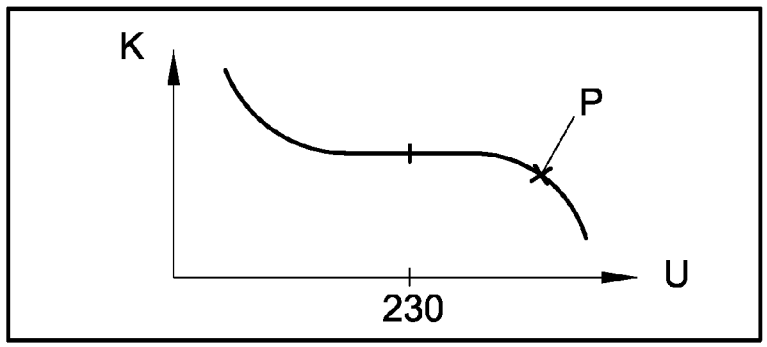

FIG. 3c shows an example for the third section of display 19, in which the currently valid curve, e.g., a curve course according to FIG. 2, for the correction factor K versus the voltage U is shown. The current operating point P=U(K,t) along the curve is shown. Instead of the correction factor K, a cent value for the billing unit kW(V)h can also be plotted on the ordinate axis.

Figure 3D:
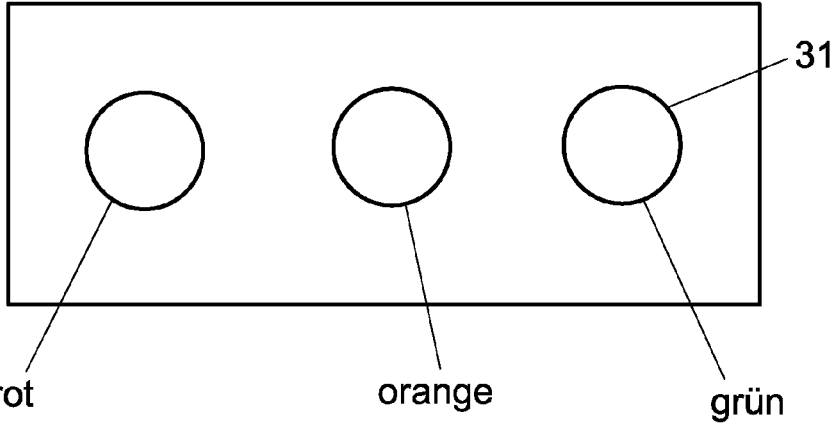

FIG. 3d shows a display with three luminous elements 31 in the colors red, yellow, and green to indicate to the consumer a postponement (red), consumption for a current need (yellow), or the immediate start of an additional energy draw-off (green) from the network.

The following additional embodiments are preferred considered by themselves and/or in conjunction with other features set forth in the claims:
i) In the case of a number of tariff categories assigned to different supply voltage values or ranges, the metering is carried out within a specific tariff category;
ii) There are at least three tariff categories, whereby a metering in the first category is activated when the supply voltage U falls below a bottom limit, whereby the metering in the third category is activated when the supply voltage U falls below a top limit, and whereby the metering in the second category is activated when the supply voltage U is in the area between the bottom and top limit;
iii) the current tariff category is indicated.

The variable billing unit kW(V)h is useful both from the consumer's side during energy withdrawal and also on the producer side during energy feed-in. If the energy feed-in occurs based on renewable energy generation, the energy generator will endeavor, independent of the dominant voltage U, to always feed into the network. In regard to biogas, water, and combined heat and power plants, the conversion of stored energy should proceed economically and with a network-stabilizing effect. The invention is suitable here for network stabilization by the integration of renewably generated wind and solar power to avoid a costly network expansion.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A meter for recording an electrical energy withdrawn from an electrical supply network, the meter comprising:
   a first component for measuring a currently supplied supply voltage; and
   a computing element for determining an operation state of the meter for calculating a billing unit based on a currently withdrawn electrical energy,
   wherein the operation state is modified in accordance with the measured supply voltage independent of electrical consumption, such that the currently supplied supply voltage that is higher or lower than a nominal voltage causes the computing element to determine that the meter is to be operated under a modified operation state based on a value of the currently supplied supply voltage that is respectively higher or lower than the nominal voltage to define the billing unit,
   wherein under the modified operation mode state, a correction factor used to adjust the billing unit is formed based on the nominal voltage of the supply network relative to the currently supplied supply voltage, and
   wherein the correction factor increases disproportionately as the measured supply voltage decreases when the measured supply voltage is less than the nominal voltage and the correction factor decreases disproportionately as the measured supply voltage increases when the measured supply voltage is greater than the nominal voltage, and
   wherein the billing unit is determined based on an amount of energy used and is adjusted by the correction factor.

2. The meter according to claim 1, wherein the correction factor is less than 1 when the measured supply voltage is greater than a top limit, and the correction factor is greater than 1, when the measured supply voltage is smaller than a bottom limit.

3. The meter according to claim 1, wherein the correction factor is a ratio of the nominal voltage of the supply network and the measured supply voltage.

4. The meter according to claim 1, wherein a voltage-dependent course of the correction factor is predetermined within a device or selected on a network side from a curve set saved within a device.

5. The meter according to claim 1, wherein
   the correction factor increases proportionally relative to the measured supply voltage when the measured supply voltage is less than a lower limit of a predetermined range of the voltage value,
   the correction factor decreases proportionally relative to the measured supply voltage when the measured supply voltage is greater than an upper limit of the predetermined range of the voltage value, and
   the correction factor is constant when the measured supply voltage is within the predetermined range of the voltage value.

6. The meter according to claim 1, wherein
   the correction factor increases curvilinearly relative to the measured supply voltage when the measured supply voltage is less than the nominal voltage, and
   the correction factor decreases curvilinearly relative to the measured supply voltage when the measured supply voltage is greater than the nominal voltage.

7. The meter according to claim 1, further comprising a display device for displaying the determined billing unit.

8. The meter according to claim 7, wherein the display device is configured to display at least two of the following parameters: the currently withdrawn electrical energy; a totaled amount of the billing unit weighted via the correction factor; a course of the formed correction factor; a course of the determined billing unit; an amount of the current correction factor; via a coloring, measurement of a current network support or network loading; a diagram representation of a voltage-dependent billing unit or a voltage-dependent correction factor with identification of a current operating point; and an amount of the electrical energy without a use of the correction factor, the amount of the electrical energy being weighted by the correction factor and the difference between the two amounts.

9. The electrical energy meter device according to claim 7, wherein the display device is spatially separated from the electrical energy meter device.

10. A meter for determining an electrical energy supplied to an electrical supply network, the meter comprising:
    a first component for measuring a supply voltage at a supply voltage terminal; and
    a computing element for determining an operation state of the meter for calculating a billing unit based on a currently supplied electrical energy,
    wherein the operation state is modified in accordance with the measured supply voltage independent of electrical consumption, such that the supply voltage that is higher or lower than a nominal voltage causes the computing element to determine that the meter is to be operated under a modified operation state based on a value of the supply voltage that is respectively higher or lower than the nominal voltage to define the billing unit,
    under the modified operation state, a correction factor is formed based on the nominal voltage of the supply network relative to the supply voltage, and
    the correction factor increases disproportionately as the measured supply voltage decreases when the measured supply voltage is less than the nominal voltage and the correction factor decreases disproportionately as the measured supply voltage increases when the measured supply voltage is greater than the nominal voltage, and
    the billing unit is determined based on an amount of energy used and is adjusted by the correction factor.

11. The meter according to claim 10, wherein
    the correction factor increases proportionally relative to the measured supply voltage when the measured supply voltage is less than a lower limit of a predetermined range of the voltage value,
    the correction factor decreases proportionally relative to the measured supply voltage when the measured supply voltage is greater than an upper limit of the predetermined range of the voltage value, and
    the correction factor is constant when the measured supply voltage is within the predetermined range of the voltage value.

12. The meter according to claim 10, wherein
the correction factor increases curvilinearly relative to the measured supply voltage when the measured supply voltage is less than the nominal voltage, and
the correction factor decreases curvilinearly relative to the measured supply voltage when the measured supply voltage is greater than the nominal voltage.

13. An electrical energy meter device,
wherein the electrical energy meter device records an electrical consumption of electrical energy and/or electrical power withdrawn by a consumer from an electrical supply network, or for capturing the supply of electrical energy and/or electrical power which has been rendered by an energy generator to a supply network, and
wherein dependent upon a supply voltage at the electrical energy meter device, an operation state of the electrical energy meter device is changed such that when the supply voltage at the electrical energy meter device is higher than a first predetermined voltage amount, the electrical energy meter device determines a billing unit as a basis for a lower billed amount than at a supply voltage lower than the first predetermined voltage amount, and that when the supply voltage at the electrical energy meter device is lower than a second predetermined voltage amount, the electrical energy meter device determines a billing unit as a basis for a higher billed amount than at a supply voltage higher than the second predetermined voltage amount.

14. The electrical energy meter device according to claim 13, wherein the supply voltage, in addition to determining the electrical power, is also used to generate an correction factor which is called upon to determine the billing unit while considering its chronological sequence.

15. The electrical energy meter device according claim 14, wherein a course of the correction factor is predetermined on the basis of the supply voltage or a currently applicable course is selected by a ripple control signal at a network operator from a predetermined curve set.

16. The electrical energy meter device according to claim 14, wherein the correction factor is multiplied by the withdrawn electrical energy and/or electrical power, in a case of consumption, or by the rendered electrical energy and/or electrical power in a case of supply, and wherein at current voltages above an upper limit is less than 1, and at the current voltages below a lower limit is greater than 1.

17. The electrical energy meter device according to claim 16, wherein the correction factor is the ratio derived from a nominal voltage of the electrical supply network and a currently present voltage.

18. The electrical energy meter device according to claim 16, wherein the correction factor increases disproportionately in at least one subsection of voltages below a nominal voltage, and preferably falls disproportionately in at least one subsection of voltages above the nominal voltage.

19. The electrical energy meter device according to claim 14, wherein a display device in which a visual illustration that shows a measure for the value of the billing unit is provided.

20. The electrical energy meter device according to claim 19, wherein the display device is set up to display at least two of the following parameters: a totaled amount of the billing unit without use of the correction factor, a totaled amount of the billing unit adjusted by the correction factor a course of the determined correction factor, a course of the determined billing unit, an amount of the currently present correction factor, a measure for the current network support or network loading by coloring, a diagram of the billing unit or correction factor on the basis of voltage with identification of a current operating point, and an amount of the electrical energy accumulated without use of the correction factor, an adjusted amount of the electrical energy accumulated with the use of the correction factor, and a measure for the difference between the two amounts.

21. The electrical energy meter device according to claim 19, wherein the display device is spatially separated from the electrical energy meter device.

22. An electrical energy meter device connectable to an energy supply network that supplies electric energy from at least one power source, comprising:
an input terminal that receives the electric energy or electric power supplied from the energy supply network;
a computing element that adjusts a billing unit based on a supply voltage amount available at the input terminal and
calculates a billing amount based on the adjusted billing unit,
wherein, when the supply voltage amount available at the input terminal is higher than a predetermined supply voltage amount, the computing element disproportionately decreases the billing unit based on the supply voltage amount being more than the predetermined supply voltage amount, and when the supply voltage amount available at the input terminal is lower than the predetermined supply voltage amount, the computing element disproportionately increases the billing unit based on the supply voltage amount being less than the predetermined supply voltage amount.

23. The electrical energy meter device according to claim 22, wherein the computing element calculates the billing amount also based on consumption of the electrical energy.

* * * * *